(12) United States Patent
Sato et al.

(10) Patent No.: US 6,493,279 B2
(45) Date of Patent: Dec. 10, 2002

(54) SEMICONDUCTOR DEVICE CAPABLE OF SIMPLE MEASUREMENT OF OSCILLATION FREQUENCY

(75) Inventors: Hirotoshi Sato; Masaki Tsukude; Tadayuki Shimizu, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/972,243

(22) Filed: Oct. 9, 2001

(65) Prior Publication Data

US 2002/0145925 A1 Oct. 10, 2002

(30) Foreign Application Priority Data

Apr. 10, 2001  (JP) ..................................... 2001-111264 P (51) Int. Cl.[7] .................................................. G11C 7/00
(52) U.S. Cl. ........................ 365/201; 365/194; 365/233
(58) Field of Search ................................. 365/201, 194, 365/233, 189.03, 189.12, 191, 222; 327/265, 279

(56) References Cited

U.S. PATENT DOCUMENTS

| | | | | |
|---|---|---|---|---|
| 5,717,652 A | * | 2/1998 | Ooishi ......................... 365/201 |
| 5,862,094 A | * | 1/1999 | Kawabata et al. ........... 365/194 |
| 6,178,108 B1 | * | 1/2001 | Miyatake et al. ............ 365/145 |
| 6,215,345 B1 | * | 4/2001 | Yashiba et al. .............. 327/265 |
| 6,385,125 B1 | * | 5/2002 | Ooishi et al. ................ 365/201 |

\* cited by examiner

Primary Examiner—Michael S. Lebentritt
Assistant Examiner—Hien Nguyen
(74) Attorney, Agent, or Firm—McDermott, Will & Emery (57) ABSTRACT

In a test mode, a first switch circuit is inactivated, and second and third switch circuits are activated. The oscillation frequency of a ring oscillator can be measured by measuring a delay value from the time a signal is input from a node inputting a test signal to the time it is output through the second switch circuit, inversion and delay circuit and the third switch circuit. Therefore, a semiconductor device capable of a simple measurement of the oscillation frequency can be provided.

9 Claims, 9 Drawing Sheets

SEMICONDUCTOR DEVICE CAPABLE OF SIMPLE MEASUREMENT OF OSCILLATION FREQUENCY

BACKGROUND OF THE INVENTION

1. Field of the Invention

The present invention relates to a semiconductor device, and more particularly to a semiconductor device including an oscillation circuit for producing a signal having a prescribed period.

2. Description of the Background Art

An oscillation circuit such as a ring oscillator is often provided when there is a need for a clock signal changing at a prescribed period inside a semiconductor device. Conventionally, for a ring oscillator, an applied bias potential was changed by a switch using a fuse, and the frequency of a ring oscillator was changed, of which output was externally taken out for monitoring.

However, in order to measure the frequency of a ring oscillator accurately, it was necessary to start an oscillation and wait until it becomes stable before measuring an oscillation frequency.

Further, in order to measure the frequency of a self-oscillating signal automatically, a test machine needs to be equipped with such a function.

SUMMARY OF THE INVENTION

An object of the present invention is to provide a semiconductor device capable of monitoring an oscillation frequency in a simple manner and regulating the same.

In summary, the present invention provides a semiconductor device having a normal mode and a test mode as operation modes, including an oscillation circuit and an internal circuit.

The oscillation circuit self-oscillates and outputs a clock signal in the normal mode. The internal circuit operates in response to the clock signal.

The oscillation circuit includes an inversion and delay circuit and a path switch portion.

The inversion and delay circuit delays and inverts a signal applied to a first internal node and outputs the signal to a second internal node. In normal mode, the path switch portion forms a loop which transmits a signal at the second internal node to the first internal node and generates the clock signal. In the test mode, the path switch portion transmits an externally applied test input signal to the first internal node, and externally outputs as a monitor signal a signal output to the second internal node in response to the test input signal.

Therefore, it is the main advantage of the present invention that the oscillation frequency of the oscillation circuit self-oscillating in the normal mode can be easily measured in the test mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described in detail with reference to the figures. It is noted that the same reference characters refer to the same or corresponding components in the figures.

First Embodiment

Figure 1:
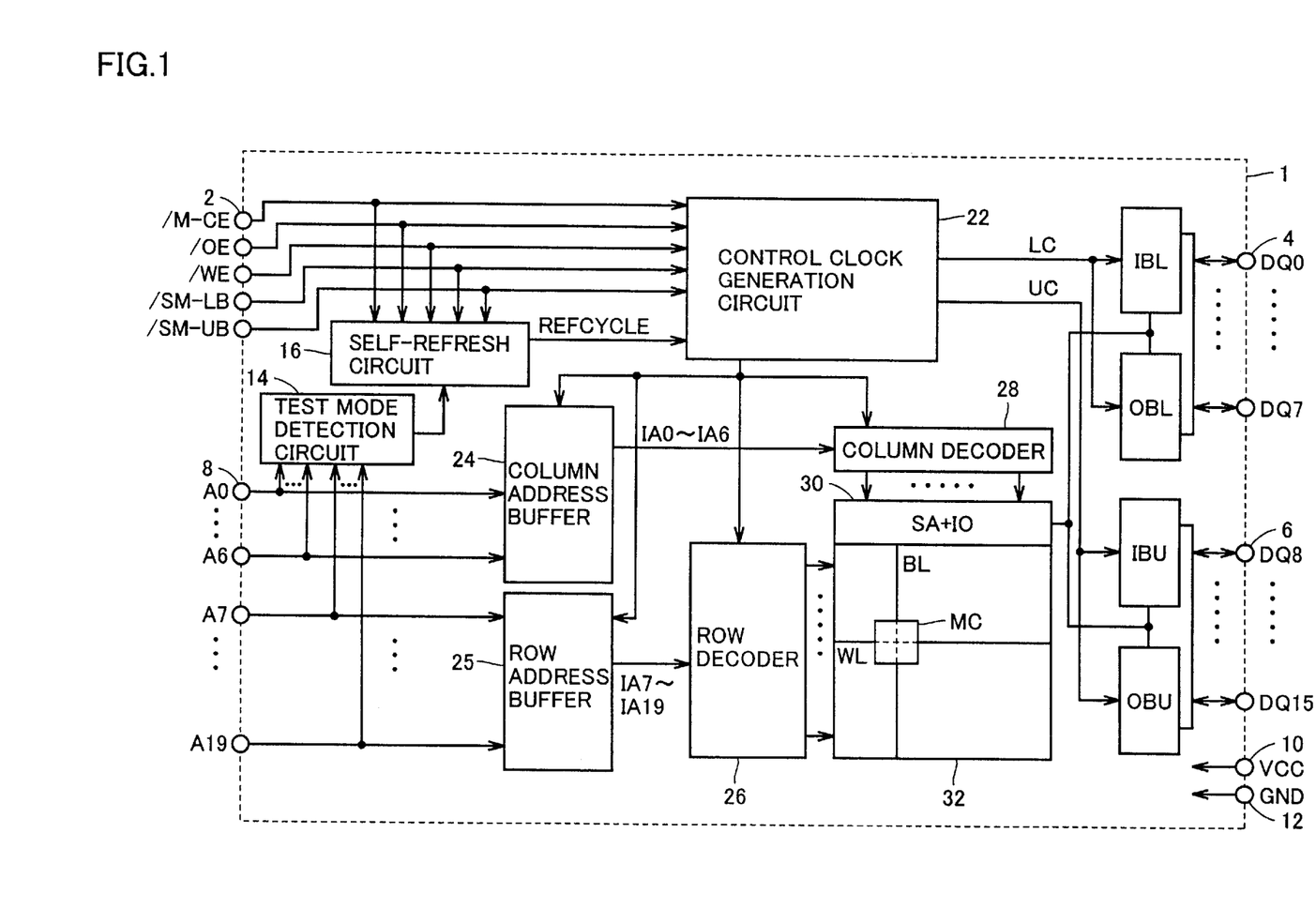
FIG. 1 is a schematic block diagram showing a configuration of an exemplary semiconductor device 1 in accordance with the present invention.

FIG. 1 is a schematic block diagram showing a configuration of an exemplary semiconductor device 1 in accordance with the present invention.

Referring to FIG. 1, semiconductor device 1 includes an input terminal group 2 receiving control signals /M-CE, /OE, /WE, /SM-LB, ISMUB, a terminal group 4 inputting and outputting data signals DQ0–DQ7, a terminal group 6 inputting and outputting data signals DQ8–DQ15, a terminal group 8 inputting and outputting address signals A0–A19, a power supply terminal 10 supplied with a power supply potential VCC, and a ground terminal 12 supplied with a ground voltage GND.

Control signal /M-CE is a chip enable signal for selecting when semiconductor device 1 is externally accessed. Control signal/OE is an output enable signal setting semiconductor device 1 to a read mode and activating an output buffer. Control signal /WE is a write enable signal setting semiconductor device 1 to a write mode. Control signal /SM-LB is a signal for selecting data input and output to and from data terminal group 4 on the lower bit side. Control signal /SM-UB is a signal for selecting data input and output to and from data terminal group 6 on the upper bit side.

Semiconductor device 1 further includes a test mode detection circuit 14 receiving address signals A0–A19 to detect a test mode and outputting various kinds of test signals, a self-refresh circuit 16 responsive to a signal from input terminal group 2 and an output of test mode detection circuit 14 for outputting a signal REFCYCLE indicative of a self-refresh cycle when detecting that semiconductor device 1 is not accessed, and a control clock generation circuit 22 responsive to a signal applied from input terminal group 2 and signal REFCYCLE for outputting for each block a control clock corresponding to a prescribed operation mode of semiconductor device 1.

Semiconductor device 1 further includes a column address buffer 24 receiving and internally transmitting address signals A0–A6 in response to an output of control clock generation circuit 22, and a row address buffer 25 receiving and internally transmitting address signals A7–A19 in response to an output of control clock generation circuit 22.

Semiconductor device 1 further includes a row decoder 26 receiving internal address signals IA7–IA19 output from row address buffer 25 in response to an output of control clock generation circuit 22 and selecting a word line WL, a column decoder 28 receiving internal address signals IA0–IA6 output from column address buffer 24 in response to an output of control clock generation circuit 22 and selecting a bit line BL, a memory cell array 32 including memory cells MC arranged in a matrix, a sense amplifier and input/output control circuit 30 amplifying and reading an output from memory cell array 32.

Note that in FIG. 1, a word line WL, a bit line BL and a memory cell MC are respectively shown representative of a plurality of memory cells MC which memory cell array 32 includes.

Each memory cell MC, though not shown, includes an access transistor AT having one end connected to a corresponding bit line BL and its gate connected to a corresponding word line, and a capacitor C connected between the other end of access transistor AT and a cell plate.

Semiconductor device 1 further includes a lower bit side input buffer IBL responsive to a lower bit control signal LC output from control clock generation circuit 22 for receiving data signals DQ0–DQ7 from terminal group 4 and transmitting the same to sense amplifier and input/output control circuit 30, a lower bit side output buffer OBL responsive to a control signal LC for receiving a signal from sense amplifier and input/output control circuit 30 and outputting a data signal to terminal group 4, an upper bit side input buffer IBU responsive to an upper bit control signal UC output from control clock generation circuit 22 for receiving data signals DQ8–DQ15 from terminal group 6 and transmitting the same to sense amplifier and input/output control circuit 30, and an upper bit side output buffer OBU outputting to terminal group 6 the data read from sense amplifier and input/output control circuit 30 in response to a control signal UC.

Generally, a static random access memory (SRAM) allows easy control of an externally applied signal. For the purpose of high integration of memory cells MC, however, a memory cell of a dynamic random access memory (DRAM) is more cost effective. On the other hand, since DRAM holds information by charges stored in the memory cell, it needs a refresh operation every certain periods, resulting in a complicated control.

In semiconductor device 1 shown in FIG. 1, an externally applied signal includes an address signal and a control signal similar to those for SRAM. In other words, a semiconductor memory with mass storage and a simple operation is realized in that an external control is as simple as in SRAM, and that the memory cell used internally is the one similar to DRAM.

The memory cell of DRAM, however, needs refreshing, if a certain period has elapsed without access. Then, at the time when no access occurs, self-refresh circuit 16 instructs control clock generation circuit 22 on a refresh operation by means of signal REFCYCLE.

Figure 2:
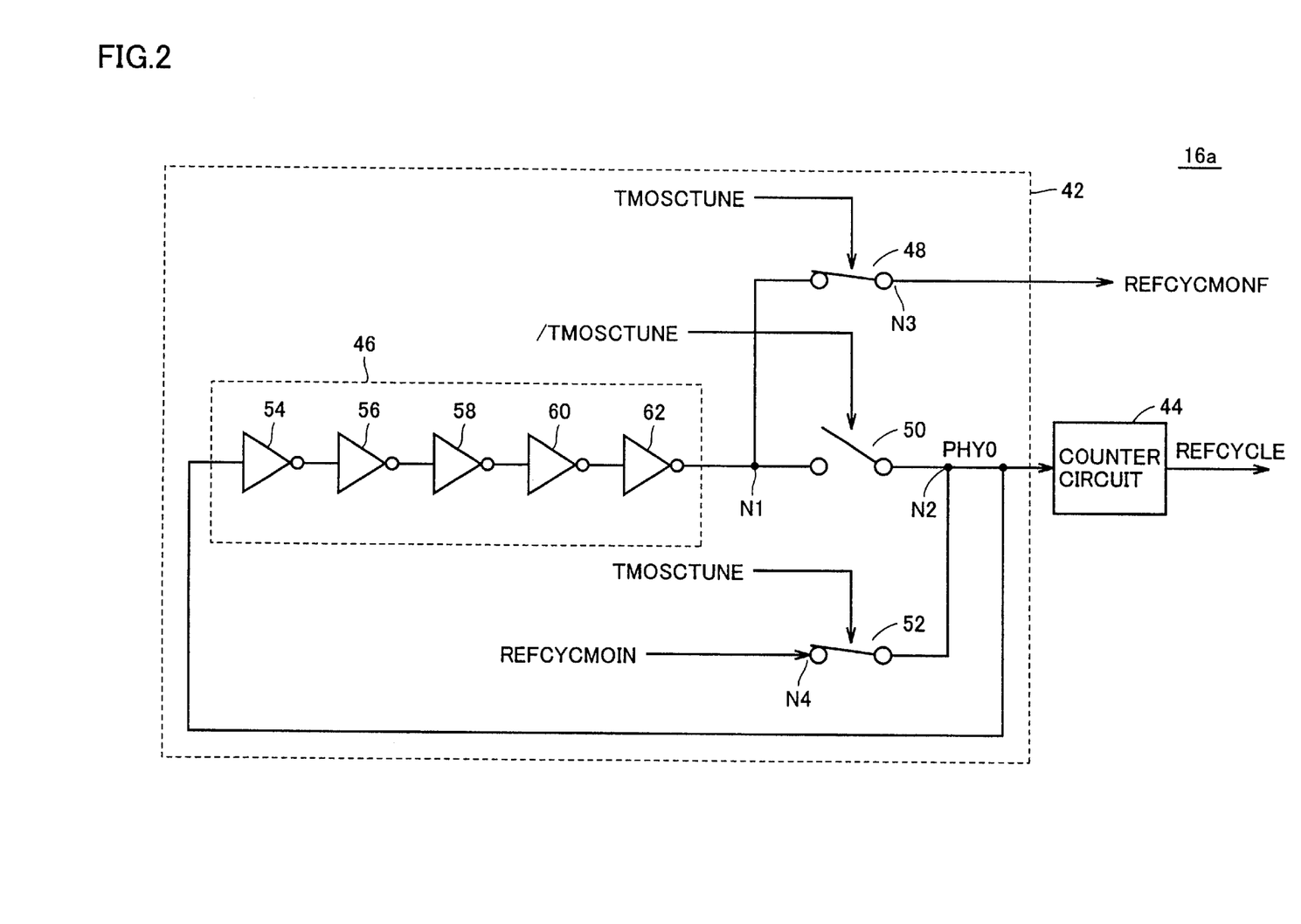
FIG. 2 is a circuit diagram showing a configuration of self-refresh circuit 16a in accordance with a first embodiment of self-refresh circuit 16 of FIG. 1.

FIG. 2 is a circuit diagram showing a configuration of self-refresh circuit 16a in accordance with the first embodiment of self-refresh circuit 16 shown in FIG. 1.

Referring to FIG. 2, self-refresh circuit 16a includes a ring oscillator 42 outputting a clock signal PHYO in the normal mode, and a counter circuit 44 frequency-dividing clock signal PHYO and outputting signal REFCYCLE indicative of a refresh period.

Ring oscillator 42 includes a switch circuit 52 which is rendered conductive in response to activation of a test signal TMOSCTUNE for connecting a node N4 receiving a test signal REFCYCMOIN to a node N2, an inversion and delay circuit 46 having its input connected to node N2 and its output connected to a node N1, a switch circuit 48 connecting node N1 to a node N3 in response to activation of test signal TMOSCTUNE, and a switch circuit 50 connecting node N1 to node N2 in response to activation of a test signal /TMOSCTUNE. It is noted that a signal REFCYCMONF as a test signal for monitoring is output from node N3.

More specifically, switch circuits 48–52 serve as a path switch portion which forms a loop transmitting a signal at node N1 to node N2 and generating the clock signal in the normal mode, and which transmits an externally applied test input signal REFCYCMOIN to node N2 and externally outputs as a monitor signal REFCYCMONF the signal output to node N1 in response to signal REFCYCMOIN, in the test mode.

Inversion and delay circuit 46 includes an odd number of inverter stages 54–62 connected in series between node N2 and node N1.

A test mode of semiconductor device 1 will now be described. An operation different from a normal read operation and write operation is called a test mode. The test mode can be used to measure various kinds of circuit functions.

Figure 3:
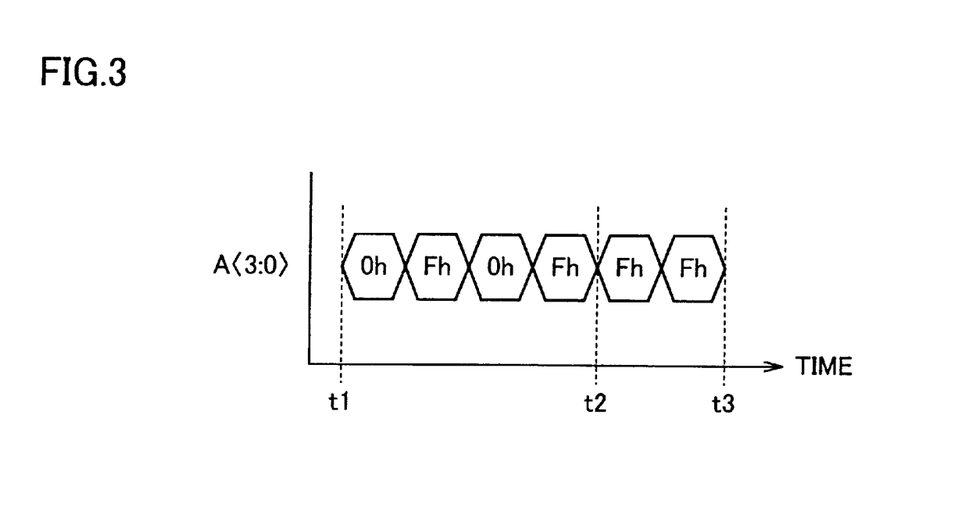
FIG. 3 is a waveform diagram illustrating how to set a test mode.

FIG. 3 is a waveform diagram illustrating how to set a test mode.

Referring to FIGS. 1 and 3, in order to set a test mode, a particular setting operation is performed for a portion of address signal A <19:0> to make test mode detection circuit 14 ready for receiving a test mode. Then, a particular signal is input successively, to set semiconductor device 1 to a prescribed test mode.

First, at times t1–t2, test mode detection circuit 14 detects that four bits of address signal A <3:0> change to 0h, Fh, 0h, Fh in this order. This establishes a receiving state in which a test mode can be specified.

Thereafter, as Fh, Fh is input as address signal A <3:0> at times t2–t3, one of multiple test modes is specified, and that test mode is set.

When a test mode is set, for example, test signals REFCYCMOIN, TMOSCTUNE are applied to self-refresh circuit 16 via test mode detection circuit 14 from any one of address signals A0–A19.

Figure 4:
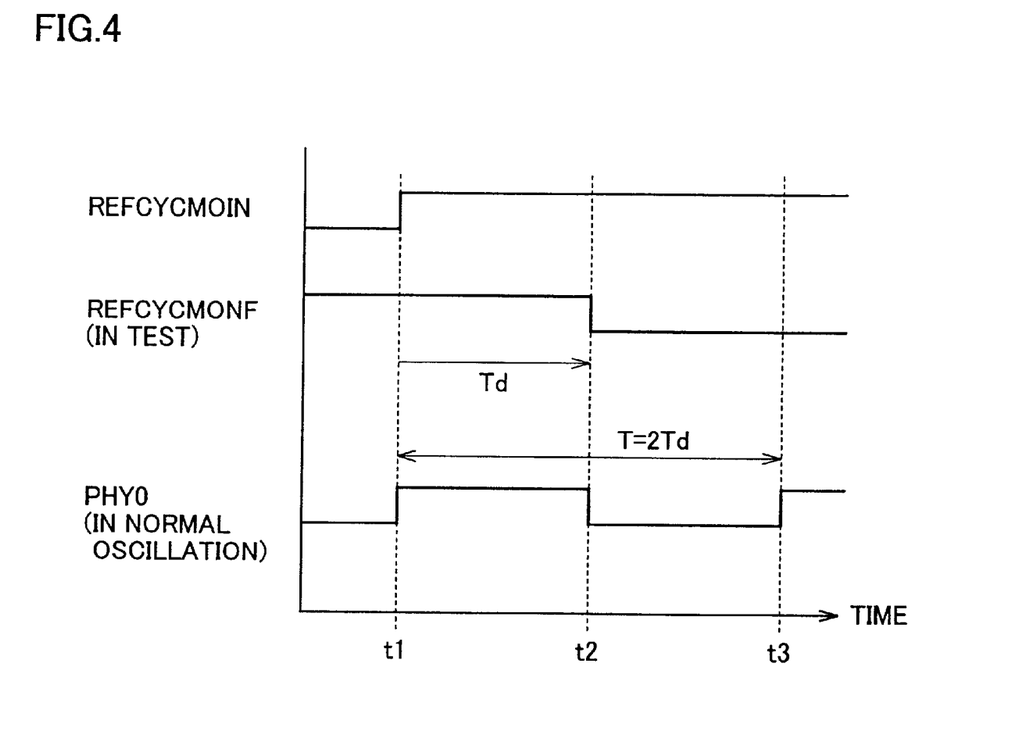
FIG. 4 is an operational waveform diagram illustrating a test operation of semiconductor device 1.

FIG. 4 is a waveform diagram illustrating a test operation of semiconductor device 1.

Referring to FIG. 4, prior to time t1, a test mode is set as described in FIG. 3, and switch circuits 48 and 52 in FIG. 2 are connected while switch circuit 50 is opened.

At the time of a test, when test signal REFCYCMOIN is externally driven from a low level to a high level, signal REFCYCMONF is output from ring oscillator 42 after a prescribed delay time Td.

More specifically, at time t1, test signal REFCYCMOIN rises from L level to H level, and then at time t2, signal REFCYCMONF falls from H level to L level through switch circuit 52, inversion and delay circuit 46 and switch circuit 48. The delay time of switch circuits 52 and 48 is considerably smaller than the delay time of inversion and delay circuit 46, and therefore it may be assumed that delay time Td is approximately equal to the delay time of inversion and delay circuit 46.

In FIG. 2, in normal operation, switch circuit 50 is connected, and switch circuits 48 and 52 are open. Therefore, clock signal PHYO is a clock signal which changes at a period in correlation with the delay time of inversion and delay circuit 46.

By observing this delay time Td, the period of clock signal PHYO in normal operation can be specified. When the rise time and the fall time of inversion and delay circuit 46 are equal, the period T of clock signal PHYO is about twice the delay time Td.

Therefore, it is unnecessary to self-oscillate ring oscillator 42 and wait for its stable oscillation before PHYO is measured, and rather, clock period T at the time of normal oscillation can be known by observing the delay time for a short time at the time of testing. Furthermore, a sophisticated test machine is not required in measurement because what to be measured is delay time Td until signal REFCYCMONF starts to change, based on an internally applied signal REFCYCMOIN.

Second Embodiment

Figure 5:
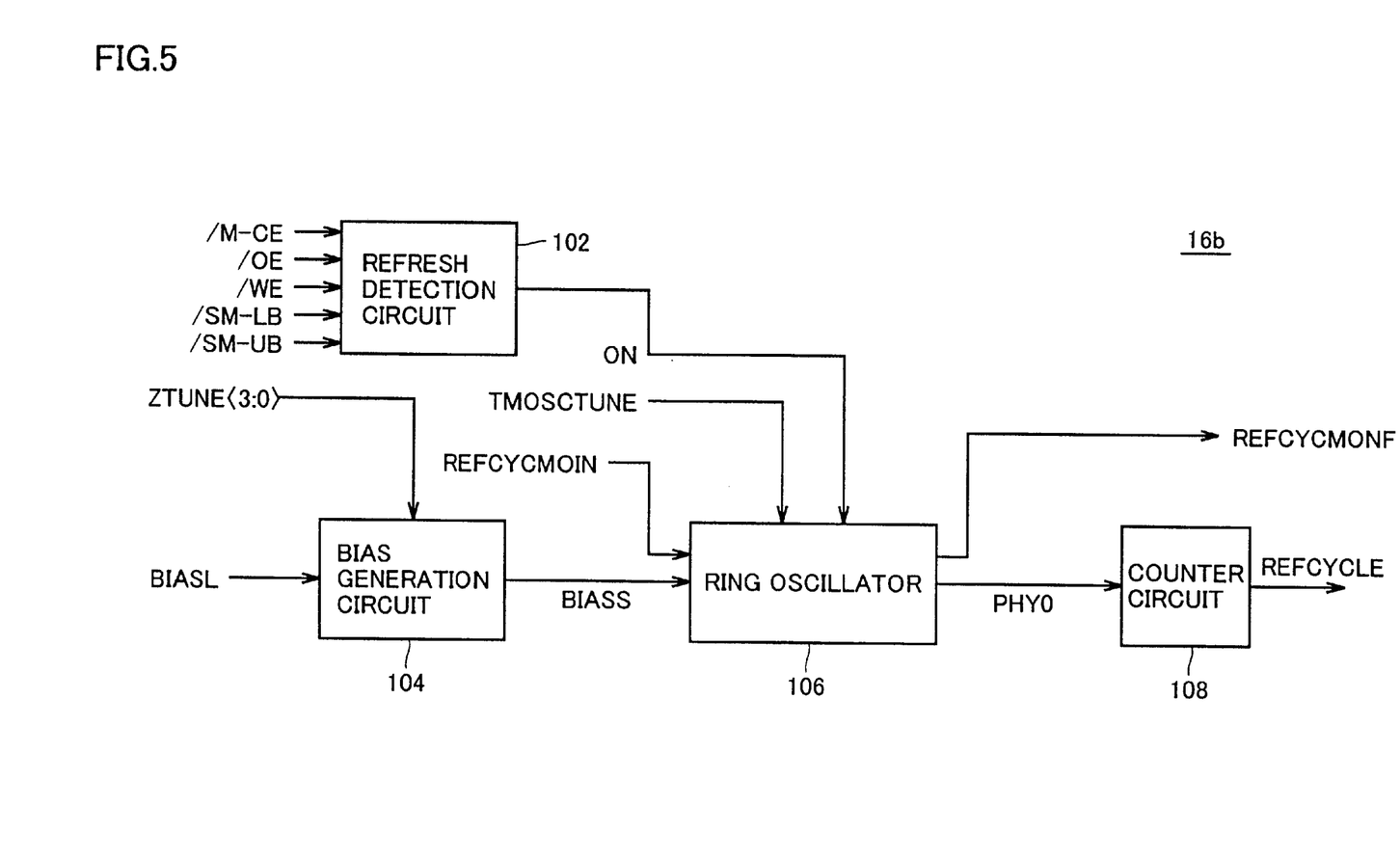
FIG. 5 is a block diagram showing a configuration of self-refresh circuit 16b in accordance with a second embodiment of self-refresh circuit 16 of FIG. 1.

FIG. 5 is a block diagram showing a configuration of self-refresh circuit 16b in accordance with a second embodiment of self-refresh circuit 16 in FIG. 1.

Referring to FIG. 5, self-refresh circuit 16b includes a refresh detection circuit 102 monitoring control signals /M-CE, /OE, /WE, /SM-LB, /SM-UB and activating a control signal ON effectuating a refresh operation when detecting that no access occurs, a bias generation circuit 104 outputting a bias signal BIASS in response to a tuning signal ZTUNE <3:0> and a bias signal BIASL which is at a prescribed constant potential between a ground potential and a power supply potential, a ring oscillator 106 outputting clock signal PHYO and signal REFCYCMONF in response to test signals TMOSCTUNE and REFCYCMOIN, control signal ON and bias signal BIASS, and a counter circuit 108 frequency-dividing dock signal PHYO and outputting signal REFCYCLE indicative of a refresh cycle.

Figure 6:
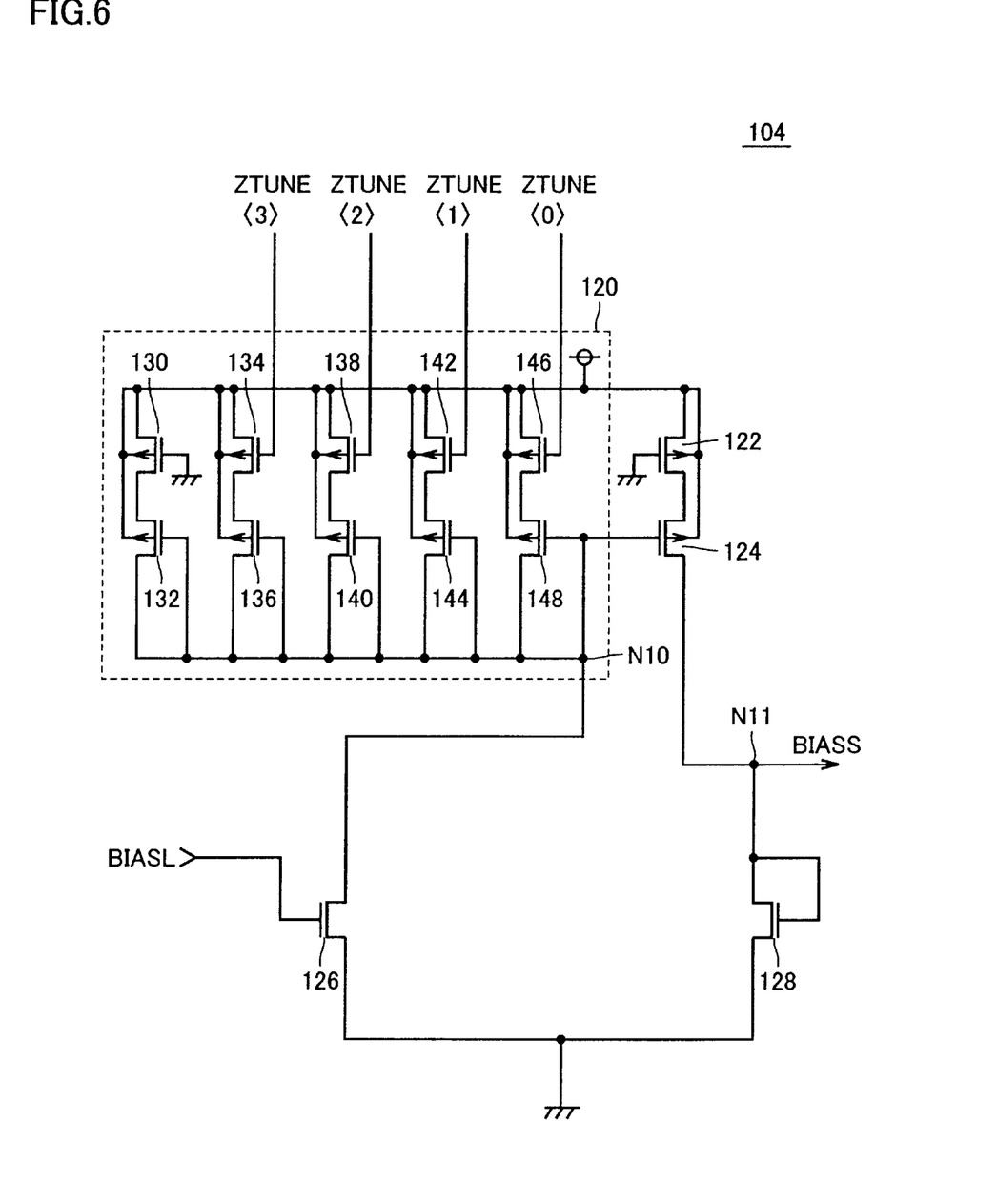
FIG. 6 is a circuit diagram showing a configuration of bias generation circuit 104 of FIG. 5.

FIG. 6 is a circuit diagram showing a configuration of bias generation circuit 104 shown in FIG. 5.

Referring to FIG. 6, bias generation circuit 104 includes an N-channel MOS transistor 126 connected between a node N10 and a ground node and having its gate receiving bias signal BIASL, an N-channel MOS transistor 128 connected between a node N11 and the ground node and having its gate connected to node N11, a current regulation circuit 120 connected between a power supply node and node N10, and P-channel MOS transistors 122 and 124 connected in series between the power supply node and node N11. P-channel MOS transistor 122 has its gate connected to a ground node. P-channel MOS transistor 124 has its gate connected to node N10. Further, P-channel MOS transistors 122 and 124 have their back gates connected together to the power supply node.

Current regulation circuit 120 includes P-channel MOS transistors 130 and 132 connected in series between the power supply node and node N10. P-channel MOS transistor 130 has its gate connected to a ground node. P-channel MOS transistor 132 has its gate connected to node N10. P-channel MOS transistors 130 and 132 have their back gates connected together to the power supply node.

Current regulation circuit 120 further includes P-channel MOS transistors 134 and 136 connected in series between the power supply node and node N10. P-channel MOS transistor 134 has its gate receiving a signal ZTUNE <3>. P-channel MOS transistor 136 has its gate connected to node N10. P-channel MOS transistors 134 and 136 have their back gates connected together to the power supply node.

Current regulation circuit 120 further includes P-channel MOS transistors 138 and 140 connected in series between the power supply node and node N10. P-channel MOS transistor 138 has its gate receiving a signal ZTUNE <2>. P-channel MOS transistor 140 has its gate connected to node N10. P-channel MOS transistors 138 and 140 have their back gates connected together to the power supply node.

Current regulation circuit 120 further includes P-channel MOS transistors 142 and 144 connected in series between the power supply node and node N10. P-channel MOS transistor 142 has its gate receiving a signal ZTUNE <1>. P-channel MOS transistor 144 has its gate connected to node N10. P-channel MOS transistors 142 and 144 have their back gates connected together to the power supply node.

Current regulation circuit 120 further includes P-channel MOS transistors 146 and 148 connected in series between the power supply node and node N10. P-channel MOS transistor 146 has its gate receiving a signal ZTUNE <0>. P-channel MOS transistor 148 has its gate connected to node N10. P-channel MOS transistors 146 and 148 have their back gates connected together to the power supply node.

By changing signals ZTUNE <0> to ZTUNE <3>, current flowing through current regulation circuit 120 is changed, so that the potential at node N11 can be regulated by a current mirror operation. Accordingly, it becomes possible to regulate the potential level of bias signal BIASS output from node N11.

Figure 7:
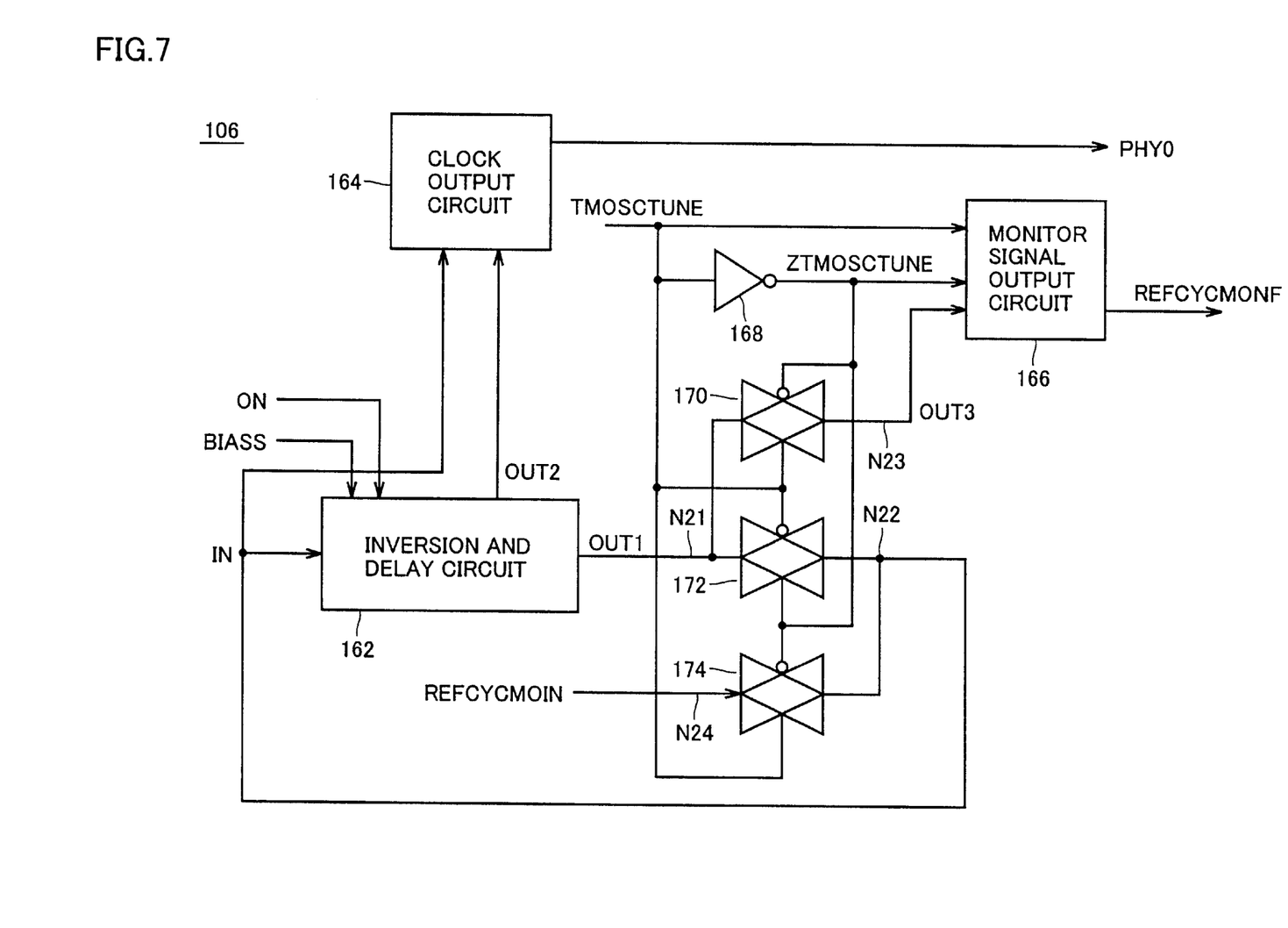
FIG. 7 is a circuit diagram showing a configuration of ring oscillator 106 of FIG. 5.

FIG. 7 is a circuit diagram showing a configuration of ring oscillator 106 shown in FIG. 5.

Referring to FIG. 7, ring oscillator 106 includes an inversion and delay circuit 162 receiving and inverting a signal IN after a prescribed delay time to output a signal OUT1 to a node N21, a transfer gate 172 connected between node N21 and a node N22, a transfer gate 174 connected between node N22 and node N24 receiving test signal REFCYCMOIN, a transfer gate 170 connected between node N21 and a node N23, and an inverter 168 receiving and inverting test signal TMOSCTUNE to output signal ZTMOSCTUNE.

Transfer gate 172 is rendered conductive when test signal TMOSCTUNE is at L level and signal ZTMOSCTUNE is at H level. On the other hand, transfer gates 170 and 174 are rendered conductive when in test mode test signal TMOSCTUNE is at H level and signal ZTMOSCTUNE is at L level.

Ring oscillator 106 further includes a clock output circuit 164 outputting clock signal PHYO in response to signal IN and a signal OUT2 output from inversion and delay circuit 162, and a monitor signal output circuit 166 outputting a signal OUT3 output to node N23 as signal REFCYCMONF in response to test signals TMOSCTUNE and ZTMOSCTUNE.

Figure 8:
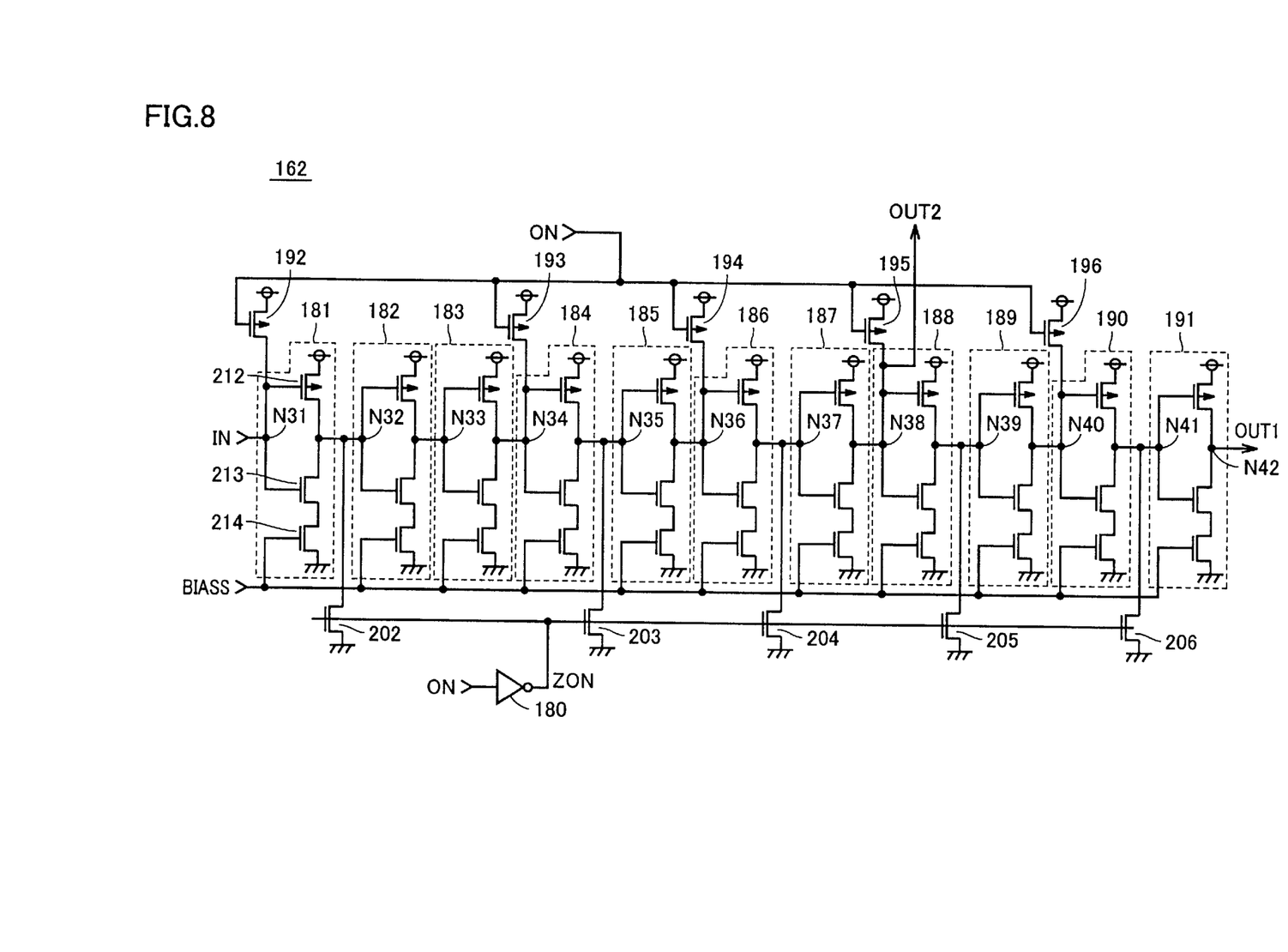
FIG. 8 is a circuit diagram showing a configuration of inversion and delay circuit 162 of FIG. 7.

FIG. 8 is a circuit diagram showing a configuration of inversion and delay circuit 162 shown in FIG. 7.

Referring to FIG. 8, inversion and delay circuit 162 includes an inverter 180 receiving and inverting control signal ON to output a signal ZON, and eleven stages of inverters 181–191 connected in series between a node N42 outputting signal OUT1 and a node N31 receiving signal IN.

Inversion and delay circuit 162 further includes a P-channel MOS transistor 192 connected between an input node N31 of inverter 181 and a power supply node and having its gate receiving control signal ON, an N-channel MOS transistor 202 connected between an input node N32 of inverter 182 and a ground node and having its gate receiving signal ZON, a P-channel MOS transistor 193 connected between an input node N34 of inverter 184 and a power supply node and having its gate receiving control signal ON, and an N-channel MOS transistor 203 connected between an input node N35 of inverter 185 and a ground node and having its gate receiving signal ZON.

Inversion and delay circuit 162 further includes a P-channel MOS transistor 194 connected between an input node N36 of inverter 186 and a power supply node and having its gate receiving control signal ON, an N-channel MOS transistor 204 connected between an input node N37 of inverter 187 and a ground node and having its gate receiving signal ZON, a P-channel MOS transistor 195 connected between an input node N38 of inverter 188 and a power supply node and having its gate receiving control signal ON, an N-channel MOS transistor 205 connected between an input node N39 of inverter 189 and a ground node and having its gate receiving signal ZON, a P-channel MOS transistor 196 connected between an input node N40 of inverter 190 and a power supply node and having its gate receiving control signal ON, and an N-channel MOS transistor 206 connected between an input node N41 of inverter 191 and a ground node and having its gate receiving signal ZON.

Inverter 187 outputs signal OUT2 to node N38, and this signal OUT 2 is transmitted to clock output circuit 164 in FIG. 7.

Inverter 181 includes a P-channel MOS transistor 212 and N-channel MOS transistors 213 and 214 connected in series between a power supply node and a ground node. N-channel MOS transistor 214 has its gate receiving bias signal BIASS. P-channel MOS transistor 212 and N-channel MOS transistor 213 have their gates receiving together an input signal of this inverter 181. Further, an output signal of this inverter 181 is output from a connection node of P-channel MOS transistor 212 and N-channel MOS transistor 213.

Inverters 182–191 have the respective configurations similar to inverter 181, and therefore the corresponding description will not be repeated.

Figure 9:
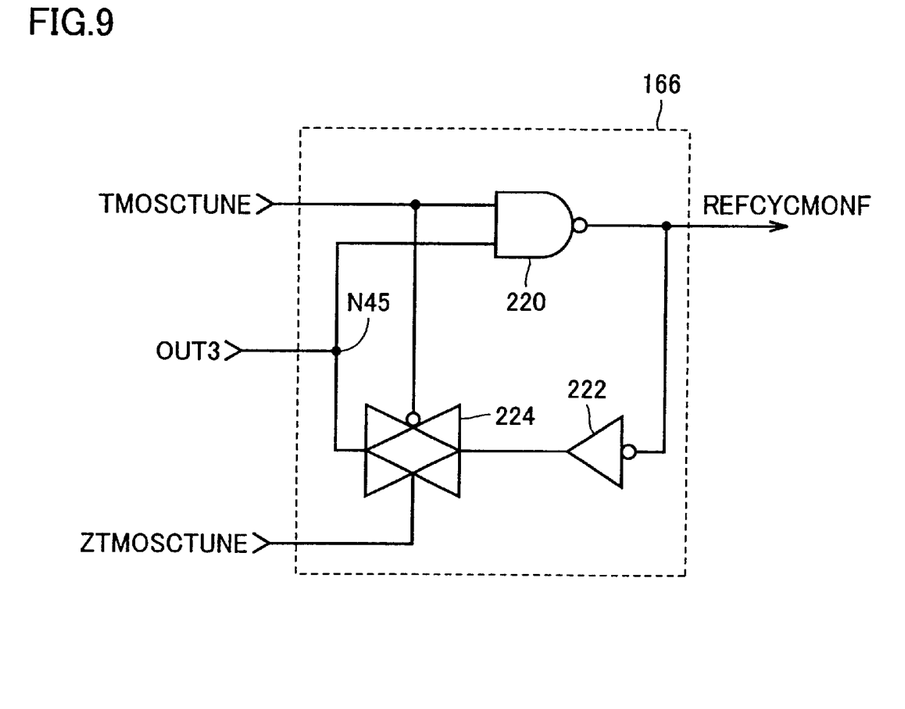
FIG. 9 is a circuit diagram showing a configuration of monitor signal output circuit 166 of FIG. 7.

FIG. 9 is a circuit diagram showing a configuration of monitor signal output circuit 166 shown in FIG. 7.

Referring to FIG. 9, monitor signal output circuit 166 includes an NAND circuit 220 receiving signal OUT3 provided from a node N45 and test signal TMOSCTUNE, an inverter 222 receiving and inverting an output of NAND circuit 220, and transfer gate 224 conductive when signal ZTMOSCTUNE is at H level and signal TMOSCTUNE is at L level for providing an output of inverter 222 to node N45.

Figure 10:
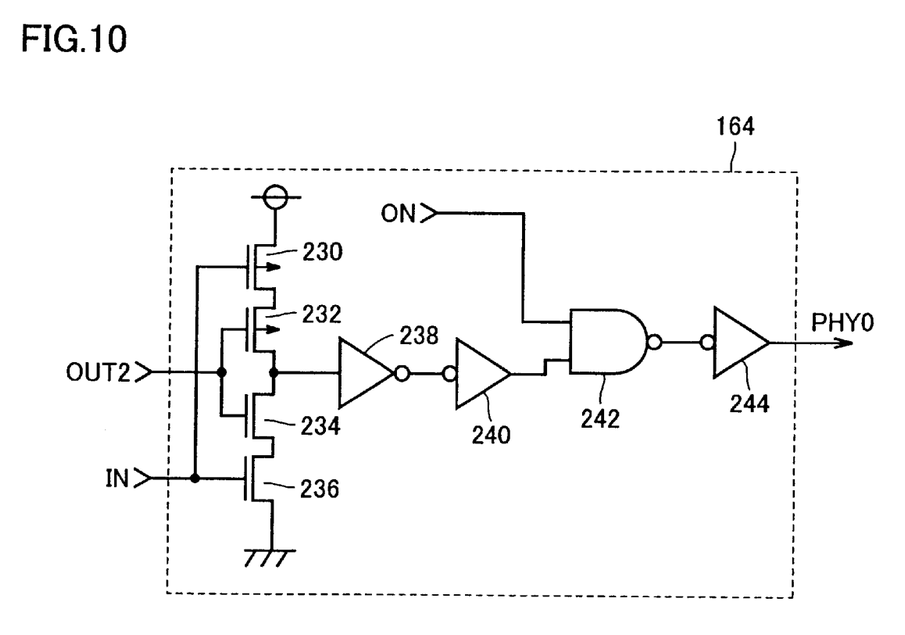
FIG. 10 is a circuit diagram showing a configuration of clock output circuit 164 of FIG. 7.

FIG. 10 is a circuit diagram showing a configuration of clock output circuit 164 shown in FIG. 7.

Referring to FIG. 10, clock output circuit 164 includes P-channel MOS transistors 230 and 232 and N-channel MOS transistors 234 and 236 connected in series between a power supply node and a ground node. P-channel MOS transistor 230 and N-channel MOS transistor 236 have their gates receiving signal IN. P-channel MOS transistor 232 and N-channel MOS transistor 234 have their gates receiving signal OUT2. In this manner, by receiving two signals in an oscillation path, current passing through transistors 230–236 can be reduced.

Clock output circuit 164 further includes an inverter 238 having its input connected to a connection node of P-channel MOS transistor 232 and N-channel MOS transistor 234, an inverter 240 receiving and inverting an output of inverter 238, an NAND circuit 242 receiving control signal ON and an output of inverter 240, and an inverter 244 receiving and inverting an output of NAND circuit 242 to output clock signal PHYO.

Regulation of the ring oscillator in accordance with the second embodiment will now be described.

Inversion and delay circuit 162 shown in FIG. 8 is configured with in total eleven stages of an odd number of inverter stages. Each node attains high and low levels repeatedly at a certain frequency. The period of this frequency is regulated by the applied voltage level of bias signal BIASS.

Figure 11:
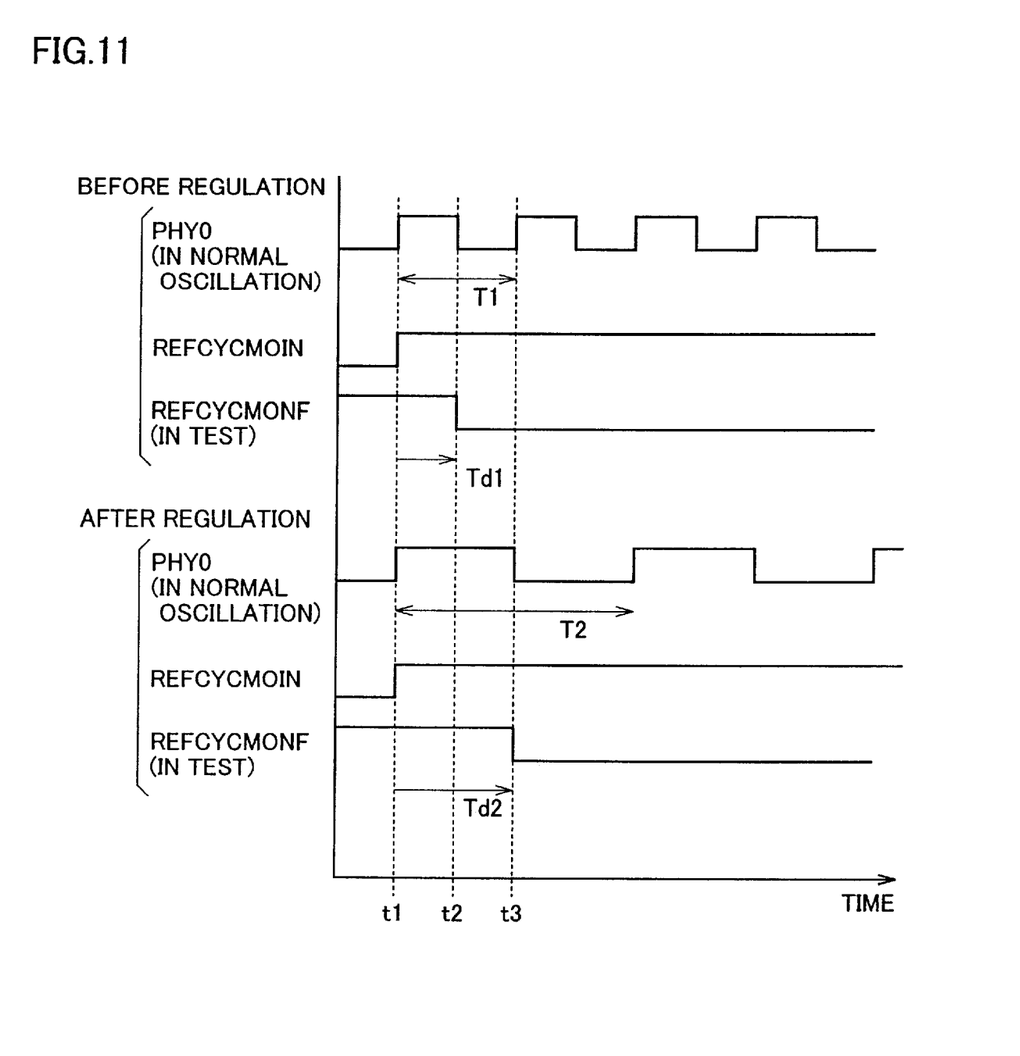
FIG. 11 is an operational waveform diagram illustrating regulation of clock frequency in accordance with the second embodiment.

FIG. 11 is a waveform diagram illustrating the regulation of clock frequency in accordance with the second embodiment.

Referring to FIGS. 7 and 11, in the normal mode, the signal transmitting path in case where self-oscillation takes place is inversion and delay circuit 162 and transfer gate 172.

Self-oscillation causes periodical changes of signal IN and signal OUT2, which are detected by clock output circuit 164 and output to the other block as clock signal PHYO. At this time, transfer gates 170 and 174 are kept inactive.

First, before regulation, the period of clock signal PHYO is assumed to be T1.

In order to measure this period T1, such a test sequence as illustrated in FIG. 3 is used to set a test mode. In the test mode, transfer gate 172 is inactivated, and transfer gates 170 and 174 are activated. Then, delay time Td1 is measured by externally inputting test signal REFCYCMOIN and monitoring signal REFCYCMONF.

As a result, it is assumed that the period T1 of clock signal PHYO in normal oscillation is shorter than a desired time.

Thereafter, the regulation is performed to make clock period T1 even longer, T2. This regulation is performed by changing tuning signal ZTUNE <3:0> applied to bias generation circuit 104 shown in FIG. 6. This tuning signal can be provided, for example, from a bit of a prescribed address signal via test mode detection circuit 14 in FIG. 1.

In the test mode, tuning signal ZTUNE <3:0> is determined such that delay time Td2 from test signal REFCYCMOIN to signal REFCYCMONF corresponds to the period of desired oscillation frequency. Therefore, the oscillation frequency of clock signal PHYO can be set to the desired oscillation period T2 at the time of normal oscillation.

As described above, in accordance with the embodiment of the present invention, the delay value of the oscillation circuit can be measured from the outside. Furthermore, it is possible to externally regulate a bias current and regulate the oscillation frequency of the oscillation circuit. Thus, the oscillation frequency of the oscillation circuit can be easily regulated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a normal mode and a test mode as operation modes, comprising:

an oscillation circuit self-exciting and outputting a clock signal in said normal mode, including an inversion and delay circuit delaying and inverting a signal applied to a first internal node and outputting the signal to a second internal node, and a path switch portion forming a loop which transmits a signal at said second internal node to said first internal node and generates said clock signal in said normal mode, and transmitting an externally applied test input signal to said first internal node and externally outputting as a monitor signal a signal output to said second internal node in response to said test input signal in said test mode; and an internal circuit operating in response to said clock signal.

2. The semiconductor device according to claim 1, wherein said path switch portion includes
   a first switch circuit rendered conductive in said normal mode for connecting said second internal node to said first internal node,
   a second switch circuit rendered conductive in said test mode for connecting a node receiving said test input signal to said first internal node, and
   a third switch circuit rendered conductive in said test mode for connecting a node outputting said monitor signal to said second internal node.

3. The semiconductor device according to claim 2, wherein said first to third switch circuits have first to third transfer gates, respectively, said second and third transfer gates are rendered conductive in response to a test signal activated in said test mode, and said first transfer gate is rendered conductive in response to a signal complementary to said test signal.

4. The semiconductor device according to claim 1, wherein said inversion and delay circuit has a plurality of inverters connected in series, each having a delay time changed in response to a bias voltage, and said oscillation circuit further includes a bias circuit changing said bias voltage in response to an externally applied tuning signal.

5. The semiconductor device according to claim 4, wherein said bias circuit has
   a first P-channel MOS transistor connected on a path coupling said third internal node to a power supply node and having its gate connected to a fourth internal node,
   a first N-channel MOS transistor connected between said third internal node and a ground node and having its gate connected to said third internal node,
   a second N-channel MOS transistor connected between said fourth internal node and the ground node and having its gate receiving a prescribed reference potential, and
   a regulation portion connected between said power supply node and said fourth internal node and regulating current flowing from said power supply node to said fourth internal node in accordance with said tuning signal, and said regulation portion has
   a plurality of third P-channel MOS transistors connected in parallel between said power supply node and said fourth internal node and having their gates connected together to said fourth internal node for forming a current mirror with said first P-channel MOS transistor, when selected, and
   a select portion determining a number of said plurality of third P-channel MOS transistors to be selected in response to said tuning signal.

6. The semiconductor device according to claim 4, wherein said bias circuit has
   a first P-channel MOS transistor connected on a path coupling said third internal node to a power supply node and having its gate connected to a fourth internal node,
   a first N-channel MOS transistor connected between said third internal node and a ground node and having its gate connected to said third internal node,
   a second N-channel MOS transistor connected between said fourth internal node and the ground node and having its gate receiving a prescribed reference potential, and
   a regulation portion connected between said power supply node and said fourth internal node and regulating current flowing from said power supply node to said fourth internal node in response to said tuning signal, said regulation portion has third and fourth P-channel MOS transistors connected in series between said power supply node and said fourth internal node, said third P-channel MOS transistor has its gate receiving said tuning signal, and said fourth P-channel MOS transistor has its gate connected to said fourth internal node.

7. The semiconductor device according to claim 1, wherein said internal circuit includes a memory cell array having a plurality of dynamic memory cells;

said semiconductor device further comprising a signal output circuit outputting a signal indicative of a refresh period of said memory cell array in response to said clock signal.

8. The semiconductor device according to claim 7, wherein in said memory cell array, a memory cell to be accessed is specified in response to an address signal, said address signal including
   a plurality of column address bits and
   a plurality of row address bits provided together with said plurality of column address bits; and said internal circuit further includes
   a column decoder selecting a column of said memory cell array in response to said plurality of column address bits, and
   a row decoder selecting a row of said memory cell array in response to said plurality of row address bits.

9. The semiconductor device according to claim 8, further comprising a test mode detection circuit detecting said test mode in response to said address signal.

* * * * *